United States Patent [19]

Na

[11] Patent Number: 5,245,437
[45] Date of Patent: Sep. 14, 1993

[54] METHOD FOR SELECTING CHANNELS IN A VIDEO SYSTEM USING A NATIONAL TELEVISION SYSTEM COMMITTEE (NTSC) SYSTEM

[75] Inventor: Il-Ku Na, Ahnyang, Rep. of Korea

[73] Assignee: SamSung Electronics Co., Ltd., Suwon, Rep. of Korea

[21] Appl. No.: 598,759

[22] Filed: Oct. 15, 1990

Related U.S. Application Data

[63] Continuation of Ser. No. 404,762, Sep. 8, 1990, abandoned.

[30] Foreign Application Priority Data

Dec. 29, 1988 [KR] Rep. of Korea ............... 1988-17812

[51] Int. Cl.⁵ ............................................... H04N 5/50
[52] U.S. Cl. ............................ 358/191.1; 358/193.1; 358/195.1; 455/182.1
[58] Field of Search ............... 358/191.1, 193.1, 195.1; 455/164, 164, 182, 185, 186, 192, 256

[56] References Cited

U.S. PATENT DOCUMENTS

| 4,763,195 | 8/1988 | Tults | 358/193.1 |
| 4,776,038 | 10/1988 | Testin | 455/182 |
| 4,805,230 | 2/1989 | Tanaka | 358/181.1 |
| 4,817,195 | 3/1989 | Kubo | 358/195.1 |

FOREIGN PATENT DOCUMENTS

183619 7/1990 Japan.

Primary Examiner—Tommy P. Chin
Attorney, Agent, or Firm—Robert E. Bushnell

[57] ABSTRACT

Disclosed is a method a method for selecting channels for all local broadcasts which employ the NTSC system. The improvement is capable of selecting channel 5A which is not selected by the conventional television only at the STD region and covering all regions with an Automatic Fine Tuning (AFT) function, by removing the local selection switch from the system.

19 Claims, 2 Drawing Sheets

METHOD FOR SELECTING CHANNELS IN A VIDEO SYSTEM USING A NATIONAL TELEVISION SYSTEM COMMITTEE (NTSC) SYSTEM

This is a continuation of application Ser. No. 07/404,762, filed Sep. 8, 1990, now abandoned.

BACKGROUND OF THE INVENTION

This invention relates generally to a Video Cassette Recorder (VCR) and television which employ National Television System Committee (hereinafter referred to as NTSC), and more particularly to a method for selecting channels of all local broadcasts which employ the NTSC system.

In general, the NTSC system is employed worldwide including the United State of America. As is well known, there are Standard (STD), Incremental Related Carrier (IRC), and Harmonic Related Carrier (HRC) broadcasting, regionally, in America. In conventional methods, a local selection switch manufactured in two or three stages is fitted to the television set by the set-maker beforehand. It is therefore a disadvantage of the prior television set that the proper switching operation to select a specific local channel should be made manually according to the area of reception.

SUMMARY OF THE INVENTION

It is accordingly an object of the invention to provide a method capable of selecting channel 5A which is not selected by the conventional television only at the STD region and covering all regions with Automatic Fine Tuning (AFT) function, by removing the local selection switch from the system.

According to an aspect of the invention, the method includes: a first step for selecting a channel by use of a channel up/down key, judging whether said channel is channel 5A, transferring phase locked loop (PLL) data corresponding to channel 5A of an Incremental Related Carrier mode to the tuner, said data being produced from the microcomputer, if the selected channel is channel 5A, and performing a general process if the selected channel is not channel 5A; a second step for judging whether a synchronizing signal is detected by the synchronizing signal detector, performing the general process if the synchronizing signal is detected, and judging whether an auto fine tuning search time is longer than a first pre-set time if the synchronizing signal is not detected; a third step for, if the auto fine tuning search time is longer than the first pre-set time, transferring the phase locked loop data corresponding to channel 5A of a Harmonic Related Carrier mode signal, performing the same process as in said second step with a second pre-set time, instead of the first pre-set time, or performing the general process if channel 1 is not selected; and a fourth step for, if the auto fine tuning search time is longer than the second pre-set time at said third step, judging whether channel 1 is selected by the channel up/down key, transferring the phase locked loop data corresponding to channel 5 if channel 1 is not selected.

BRIEF DESCRIPTION OF THE DRAWINGS

These and other objects as well as advantages of the present invention will become clear by the following description of preferred embodiment of the present invention with reference to the accompanying drawings, wherein.

DETAILED DESCRIPTION OF THE PREFERRED EMBODIMENTS

A preferred embodiment of the invention will now be explained in detail with reference to the accompanying drawings, only by way of example.

Figure 1:
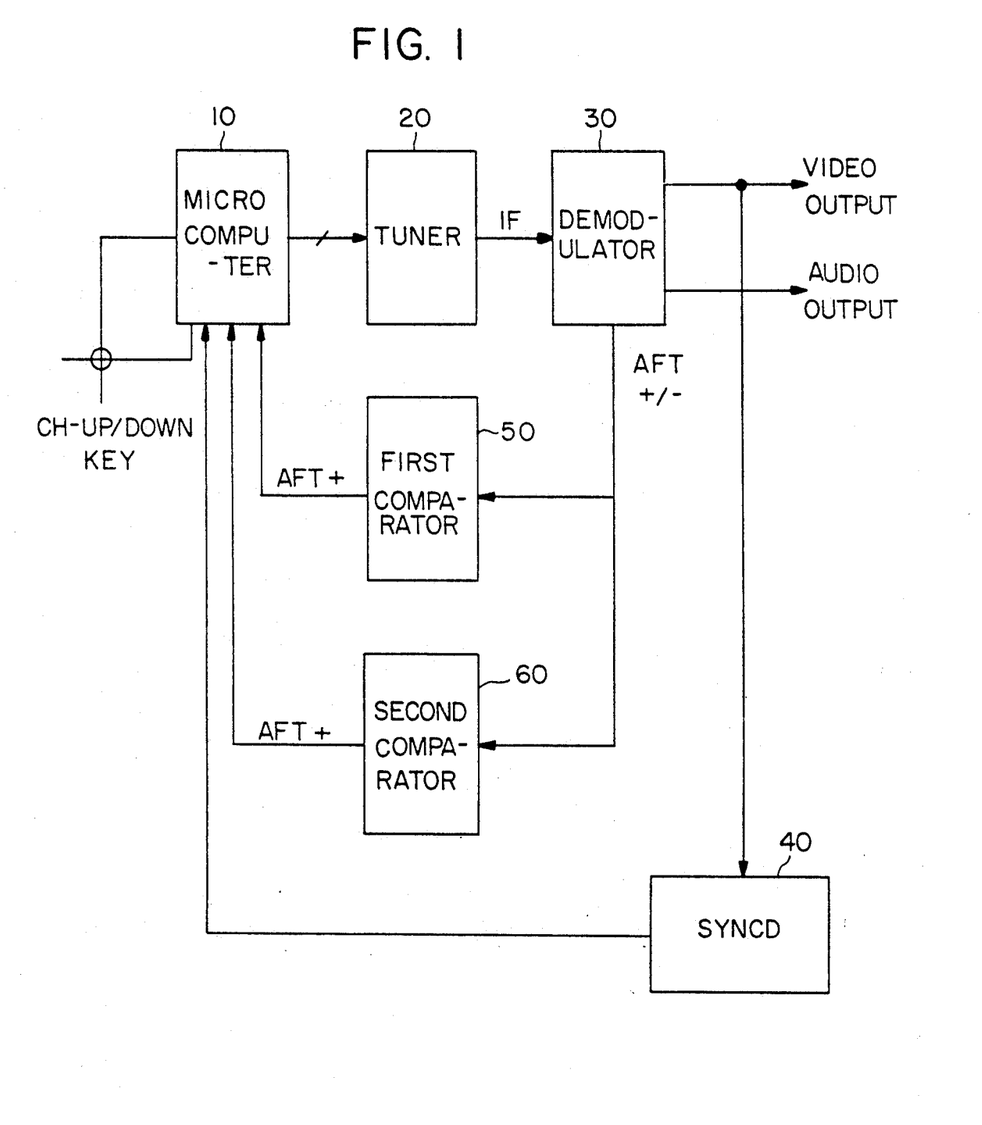
FIG. 1 is a system block diagram for carrying out the present invention.

Referring primarily to FIG. 1, there is a microcomputer 10 which produces phase locked loop (PLL) data corresponding to a channel which is selected by the key operation of a channel up/down key. The PLL data produced from the microcomputer 10 is then applied to a tuner 20 by which a radio frequency (RF) signal from the broadcasting station is tuned and by which an intermediate frequency (IF) signal is produced in response to the PLL data. Thereafter, a demodulator 30 receiving the IF signals demodulates it so as to divide the IF signals into audio and video signal, the divided audio and video signal being applied respectively to audio and video output terminals. The video signal from the demodulator 30 is applied to a synchronizing signal detector (SYNCD) 40 and a synchronizing signal therefrom is detected by the SYNCD 40, thereby being fed back to the microcomputer 10. On the other hand, an AFT search stage which includes a first comparator 50 and a second comparator 60, compares the AFT search time for the demodulated signal from the demodulator 30 with a given pre-set time and, according to the result, feeds back the AFT search signal to the microcomputer 60 in order to tune a desired broadcast signal correctly by adjusting the PLL data.

Figure 2:
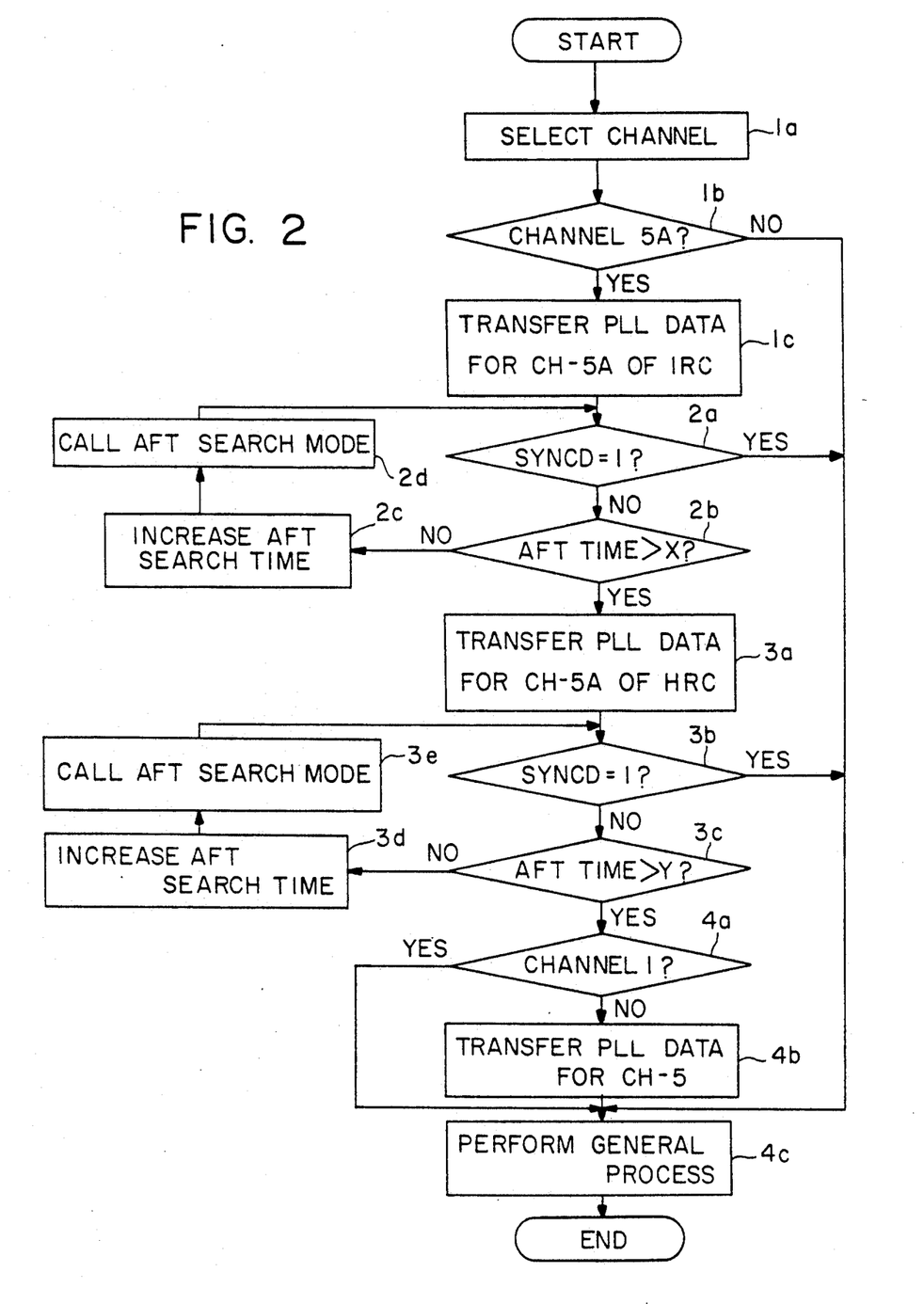
FIG. 2 is a flow chart illustrating the specific operation in accordance with an embodiment of the present invention.

In FIG. 2, a flow chart illustrating the specific operation in accordance with the preferred embodiment of the invention is shown. According to the embodiment, the operation is widely divided into four steps. That is, a first step is to select the desired channel by use of the channel up/down key or remote controller and generate the PLL data corresponding to IRC frequency of channel 5A if channel 5A was selected by the channel up/down key, or execute a general processing if channel 5A was not selected. In the step, whether the output of the SYNCD 40 is logic "1" is checked. According to the result, if it is logic "1" the general process is executed, otherwise, namely if it is logic "0", whether the AFT search time is longer than the pre-set time "X" is checked. In the above process, if the AFT search time is shorter than the pre-set time "x", the system increases the AFT time by a given step and changes the PLL data thereafter to check again if the output of the SYNCD is logic "1". Next, in a third step, if the AFT time is longer than the pre-set time "X" the PLL data corresponding to the HRC frequency of channel 5A is generated and the same procedure as in the second step is performed with another pre-set time "Y" instead of "X". Thereafter, in a fourth step, if pre-set time "Y" is shorter than the AFT search time, whether channel 1 is selected by the channel up/down key is judged by the microcomputer 10. If channel 1 was selected, the general process is performed, otherwise if channel 1 was not selected, the PLL data related to channel 5 is generated by microcomputer 10.

The detailed description of the preferred embodiment of the invention will now be followed hereinafter in accordance with the structure and features described hereinabove, with reference to FIGS. 1 and 2.

Firstly, the channel number is selected by use of the channel up/down key or the remote controller in a manner of frequency synthesizing (FS) tuning which is a frequency tuning method, currently being used widely. After the selection of the channel, the microcomputer 10 transfers to the tuner 20 the PLL data related to the selected channel, which is saved in microcomputer 10. The tuner 20 then tunes the RF signal in response to the PLL data and produces the IF signal related to the RF signal to the demodulator 30. Thereafter, the IF signal is demodulated by the demodulator 30 and the demodulated signal is separated into the video signal and audio signal to be output through the video and audio output terminals. In this case, if the received RF signal is not correctly tuned, then the initial screen can not be correctly settled. The SYNCD 40 detects instantaneously whether there is a synchronizing signal in the video signal from the demodulator 30. Therefore the AFT search operation is performed by the AFT search stage 50, 60 in response to the signal from the demodulator 30. The AFT search time is compared with the pre-set time "X" by the AFT search stage and if the AFT search time is shorter than the pre-set time "X", a given step of the AFT search time is increased and a tuned signal from the demodulator 30 is compared with the reference signal of the first and second comparator 50, 60 by the AFT search stage so as to proceed to the AFT search mode. In this manner, the compared signal is fed back to the microcomputer 10 in order to correctly tune the selected channel In conclusion, the SYNCD 40 checks whether there is a broadcast being tuned. However, since the RF signals are different by region, there is a problem in covering all geographical areas with the AFT function if the local selection switch manufactured by the set-maker is removed. The settlement for the problem will be explained with reference to the FIG. 2, hereinbelow.

The channel selection method is performed for the Cable Television (CATV) and the tuner 20 is available to select the channel numbers of 111, 140, 155, 181, and 209, in case of channel 5A. The PLL data of the microcomputer 10 is previously memorized therein as shown in the following Table 1. Exceptionally, however, in the microcomputer 10 are memorized the frequencies of the IRC and HRC mode for only channel 5A in case of the CATV. The STD mode has no channel 5A, in accordance with the Electronic Industries Association (EIA) regulation, whereas the IRC and HRC mode have channel 5A.

TABLE 1

| VHF-L | | CATV mode | | |
|---|---|---|---|---|
| | | STD | IRC | HRC |
| NAME | NO. | Fpict | Fpict | Fpict |
| 2 | 2 | 55.25 | — | — |
| 3 | 3 | 61.25 | — | — |
| 4 | 4 | 67.25 | — | — |
| 5A | 1 | — | 73.25 | 72.00 |
| 5 | 5 | 77.25 | — | — |
| . | . | . | | |
| . | . | . | | |
| . | . | . | | |

Referring back to FIG. 2, an arbitrary channel is selected at a step 1a by means of the channel up/down key or the remote controller. Then the microcomputer 10 checks at a steb 1b whether the channel selected at step 1a is channel 5A. If the result of step 1b turns out to be channel 5A, the microcomputer 10 transfers at a step 1c the corresponding PLL data related to the IRC frequency of channel 5A to the tuner 20. However, if result turns out not to be channel 5A, the system performs the general process at a step 4c.

Thereafter, at a step 2a, the SYNCD 40 receiving the video signal from the demodulator 30 checks whether there is the synchronizing signal in the video signal. If the video signal contains the synchronizing signal, in other words the output of the SYNCD 40 is logic "1", then the system performs step 4c for executing the general process. However, if the output of the SYNCD 40 is not logic "1", then whether the pre-set time "X" is shorter than the AFT search time is checked at a step 2b. In consequence, if said pre-set time "X" is not shorter, the system proceeds to a step 2c to increase the AFT time by a given step. As for the pre-set time "X", it is enough time to perform the full range of the AFT search when the PLL data related to channel 5A of the IRC mode is produced by the microcomputer 10. After increasing the AFT search time, the system proceeds to a step 2d and calls the AFT search mode to change the PLL data. According to the PLL data changed, step 2a is re-executed. On contrary to said case, however, if the pre-set time "X" is shorter than the AFT search time at step 2b, then the system judges that the synchronizing signal can not be searched during the AFT search time and the microcomputer 10 transfers the PLL data related to channel 5A of the HRC mode to tuner 20, at a step 3a. It is an assistant process to aim at more reliable operation.

In similar manner to steps 2a to 2d, whether the output of the SYNCD 40 is logic "1" is checked at a step 3b. As a result, if the output is logic "1" the general process is performed at step 4c. Whereas, if the output is not logic "1", whether the AFT search time is longer than another pre-set time "Y" is checked at a step 3c. The pre-set time "Y" is also enough time to perform the full range of the AFT search when the PLL data related to channel 5A of the HRC mode is produced by the microcomputer 10. If the pre-set time "Y" is longer than the AFT search time, then the processing step 3d and 3e will be executed in the same manner as in steps 2c and 2d.

Thereafter, if the pre-set time "Y" is shorter than the AFT search time at the step 3c, then the system checks at a step 4a whether channel is selected by the remote controller or the channel up/down key. According to the result, if channel 1 is selected, the general process will be performed at step 4c, otherwise if the channel 1 is not selected, it means that the system is placed at the STD mode region geographically. Accordingly, in this case, the pre-set times "X" and "Y" spare enough time for the AFT search to show that the pre-set time is shorter than the specific time which is required to detect the synchronizing signal, which means that there is no broadcasting signal at the channel as shown in Table 1.

That is, if the channel 1 is not selected at step 4a, the microcomputer will transfer the PLL data related to channel 5 and sequentially proceed to the step 4c to perform the general process. In other words, the system receives the channel 5 and, at the same time, displays the channel number on a visual display (not shown). In the STD mode region, the available channels are channels 2, 3, 4, 5, 6, ..., while, for the IRC and HRC mode region, they are the channels 2, 3, 4, 5A (1), 5, ....

According to another embodiment of the present invention, since the local selection switch is removed from the inventive system, it takes relatively long time to correctly tune a desired channel in the IRC and HRC mode region. To settle this problem, the PLL data corresponding to the all channels, in stead of only the channel 5A, are memorized by STD, IRC, and HRC mode frequencies into the microcomputer 10 so that the system performs the same routine described hereinabove. In this way, the tuning time can be remarkably shortened, compared with the case of using only the hardware for the AFT search, because the PLL data is changed by searching the channel desired to tune, by use of software.

As shown hereinabove in detail, the invention has n advantage of selecting channel 5A which can not be tuned in the STD mode broadcasting area, by removing the local selection switch, as well as covering nationwide broadcasting areas. Therefore, there is no need to switch the local selection switch according to the area which may be changed from one area to another, at a user's wish.

What is claimed is:

1. A method for selecting channels in a video system employing a National Television System Committee system, said video system having an interconnected microcomputer, tuner, demodulator, synchronizing signal detector, and auto fine tuning stage, said method comprising:
 a first step for selecting a channel by use of a channel up/down key, judging whether said channel is channel 5A, transferring phase locked loop data corresponding to channel 5A of an Incremental Related Carrier mode from the microcomputer to the tuner, said data being produced from the microcomputer, if the selected channel is channel 5A of the Incremental Related Carrier mode, and performing a subsequent process if said selected channel is not channel 5A of the Incremental Related Carrier mode;
 a second step for judging whether a synchronizing signal is detected by the synchronizing signal detector, performing the subsequent process if the synchronizing signal is detected, and judging whether an auto fine tuning search time is longer than a first pre-set time if the synchronizing signal is not detected:
 a third step for, if the auto fine tuning search time is longer than the first pre-set time, transferring phase locked loop data corresponding to channel 5A of a Harmonic Related Carrier mode signal, performing said second step with a second pre-set time instead of the first pre-set time; and
 a fourth step for, if the auto fine tuning search time is longer than the second pre-set time at said third step, judging whether a channel 1 is selected by the channel up/down key, and transferring phase locked loop data corresponding to a channel 5 if said channel 1 is not selected.

2. The method as recited in claim 1, wherein said second step comprises:
 a first substep for, if the first pre-set time is shorter than the auto fine tuning search time, increasing said auto fine tuning search time by increment; and
 a second substep for performing an auto fine tuning search after completion of said first substep, and thereafter re-judging whether the synchronizing signal is detected.

3. A method of selecting channels in a video system using a National Television System Committee convention, said video system having a microcomputer, tuner, demodulator, synchronizing signal detector, and auto fine tuning stage, said method comprising:
 a first step for selecting a first selectable channel by use of a channel up/down key, judging whether said first selectable channel is a spare channel, transferring phase locked loop data corresponding to a designated channel of a first carrier mode to the tuner, said data being produced from the microcomputer, if the first selectable channel is the spare channel, and exiting from the first step if said first selectable channel is not said spare channel;
 a second step for judging whether a synchronizing signal is detected by the synchronizing signal detector, exiting from the second step if the synchronizing signal is detected, and determining whether an auto fine tuning search time is longer than a first pre-set time if the synchronizing signal is not detected;
 a third step for, if the auto fine tuning search time is longer than the first pre-set carrier mode, and performing the same process as in said second step with a second pre-set time; and
 a fourth step for, if the auto fine tuning search time is longer than the second pre-set time at said third step, judging whether a second selectable channel is selected by the channel up/down key, and transferring phase locked loop data corresponding to a third selectable channel if said second selectable channel is not selected.

4. A method according to claim 3, wherein said second step comprises:
 a first sub-step for, if the first pre-set time is shorter than the auto fine tuning search time, changing said auto fine tuning search time by an increment; and
 a second sub-step for proceeding to the auto fine tuning search mode after completion of said first sub-step, changing the phase locked loop data, and thereafter determining whether the synchronizing signal is detected by the synchronizing signal detector.

5. A method of switching a video processing apparatus to be compatible with a plurality of video processing systems having different broadcasting modes, comprising the steps of:
 (i) setting first data relating to a first one of said modes, to detect a signal broadcast on a selected channel;
 (ii) attempting to detect, in accordance with said first data, a signal broadcast on the selected channel;
 (iii) upon detection of a signal in accordance with said first data, processing the detected signal in accordance with said first mode;
 (iv) in the absence of detection of a signal in accordance with said first data, setting second data relating to a second one of said modes, to detect a signal broadcast on the selected channel;
 (v) attempting to detect, in accordance with said second data, a signal broadcast on the selected channel;
 (vi) upon detection of a signal in accordance with said second data, processing the detected signal in accordance with said second mode; and
 (vii) in the absence of detection of a broadcast signal, switching the video processing apparatus to a default broadcasting mode.

6. A method according to claim 5, including repeating steps (iv) to (vi) for three or more sets of data relating to three or more of said modes.

7. A method according to claim 6, including the step of comparing said auto fine tuning search time with a second predetermined value to determine whether sufficient time has elapsed in which to detect said signal broadcast in accordance with said second one of the broadcasting modes.

8. A method according to claim 5, further comprised of detecting said signals by detecting synchronizing pulses.

9. A method according to claim 8, including the step of comparing said auto fine tuning search time with a second predetermined value to determine whether sufficient time has elapsed in which to detect said signal broadcast in accordance with said second one of the broadcasting modes.

10. A method for selecting channels in a video system using a television convention, said method comprising:
   selecting a first selectable channel;
   a first step for determining whether said first selectable channel is a first designated channel, providing first phase locked loop data for a first assigned channel of a first broadcast carrier mode to a tuner if said first selectable channel is said first designated channel, and performing a subsequent process if said first selectable channel is not said first designated channel;
   a second step for determining whether a synchronizing signal is being received for said first assigned channel of said first broadcast carrier mode, performing the subsequent process if the synchronizing signal for said first assigned channel of said first broadcast carrier mode is detected, and determining whether an auto fine tuning search time is longer than a first pre-set time if the synchronizing signal for said first assigned channel of said first broadcast carrier mode is not detected;
   a third step for, if, in said second step, the auto fine tuning search time is longer than the first pre-set time, providing phase locked loop data corresponding to a first assigned channel of a second broadcast carrier mode to said tuner;
   a fourth step for determining whether a synchronizing signal is being received for said first assigned channel of said second broadcast carrier mode, performing the subsequent process if the synchronizing signal for said second assigned channel of said second broadcast carrier mode is detected, and determining whether an auto fine tuning search time is longer than a second pre-set time if the synchronizing signal for said first assigned channel of said second broadcast carrier mode is not detected;
   a fifth step for, if in said fourth step, the auto fine tuning search time is longer than the second pre-set time, providing phase locked loop data corresponding to a second designated channel to said tuner.

11. The method as recited in claim 10, wherein said second step comprises:
   a first substep for, if the first pre-set time is shorter than the auto fine tuning search time, changing said auto fine tuning search time by an increment; and
   a second substep for performing an auto fine tuning search after completion of said first substep, and thereafter determining whether the synchronizing signal is detected.

12. A method for selecting channels in a video system, said method comprising:
   selecting a first selectable channel;
   a first step for determining whether said first selectable channel is a first designated channel, transferring first phase locked loop data for a first assigned channel of a first broadcast carrier mode to a tuner if said first selectable channel is said first designated channel;
   a second step for determining whether synchronizing signals are being received for said first assigned channel of said first broadcast carrier mode, and determining whether a first auto fine tuning search time is longer than a first pre-set time is the synchronizing signals for said first assigned channel of said first broadcast carrier mode are not detected;
   a third step for, if, in said second step, the first auto fine tuning search time is longer than the first pre-set time, transferring phase locked loop data corresponding to a first assigned channel of a second broadcast carrier mode to said tuner; and
   a fourth step for determining whether said synchronizing signals are being received from said first assigned channel of said second broadcast carrier mode, and determining whether a second auto fine tuning search time is longer than a second pre-set time if the synchronizing signals for said first assigned channel of said second broadcast carrier mode are not detected.

13. The method as recited in claim 12, further comprised of:
   a fifth step for, if, in said fourth step, the second auto fine tuning search time is longer than the second pre-set time, determining whether a second selectable channel has been selected, and transferring phase locked loop data corresponding to a second designated channel to said tuner if said second selectable channel has not be selected.

14. The method as recited in claim 12, wherein said second step comprises:
   a first substep for, if the first pre-set time is shorter than the first auto fine tuning search time, changing said first auto fine tuning search time by an increment; and
   a second substep for performing an auto fine tuning search after completion of said first substep, and thereafter determining whether the synchronizing signals are detected.

15. The method as recited in claim 13, wherein said second step comprises:
   a first substep for, if the first pre-set time is shorter than the first auto fine tuning search time, changing said first auto fine tuning search time by an increment; and
   a second substep for performing an auto fine tuning search after completion of said first substep, and thereafter determining whether the synchronizing signals are detected.

16. A video channel selector, comprising:
   tuning means for responding to phase locked loop data corresponding to selected ones of a plurality of designated channels by generating intermediate signals from broadcast carrier signals assigned to corresponding ones of said plurality of designated channels;

means for generating video signals from said intermediate signals;

detector means for obtaining synchronization signals from said video signals; and processing means, coupled to receive channel selection signals indicative of a plurality of selected channels, for:

performing a first step of determining whether a first selected channel is a first designated channel, transferring first phase locked loop data for a first assigned channel of a first broadcast carrier mode to said tuning means if said first selected channel is said first designated channel;

performing a second step of determining whether said synchronization signals are being obtained by said detector means for said first assigned channel of said first broadcast carrier mode, and determining whether a first auto fine tuning search time is longer than a first pre-set time if the synchronization signals for said first assigned channel of said first broadcast carrier mode are not being obtained by said detector means;

performing a third step of, if in said second step the first auto fine tuning search time is longer than the first pre-set time, transferring phase locked loop data corresponding to a first assigned channel of a second broadcast carrier mode to said tuning means; and performing a fourth step for determining whether said synchronization signals are being obtained by said detector means for said first assigned channel of said second broadcast carrier mode, and determining whether a second auto fine tuning search time is longer than a second pre-set time if the synchronization signals for said first assigned channel of said second broadcast carrier mode are not detected.

17. The video channel selector of claim 16, further comprised of said processing means performing a fifth step of, if in said fourth step the second auto fine tuning search time is longer than the second pre-set time, determining whether a second selected channel is selected by said channel selection signals, and transferring phase locked loop data corresponding to a second designated channel to said tuning means if said second selected channel is not selected.

18. The video channel selector of claim 16, further comprised of said processing means including within said second step:

a first substep for, if the first pre-set time is shorter than the first auto fine tuning search time, increasing said first auto fine tuning search time by an increment; and a second substep for performing an auto fine tuning search after completion of said first substep, and thereafter re-judging whether the synchronization signals are detected.

19. The video channel selector of claim 17, further comprised of aid processing means including within said second step:

a first substep for, if the first pre-set time is shorter than the first auto fine tuning search time, increasing said first auto fine tuning search time by an increment; and a second substep for performing an auto fine tuning search after completion of said first substep, and thereafter re-judging whether the synchronization signals are detected.

* * * * *

UNITED STATES PATENT AND TRADEMARK OFFICE
CERTIFICATE OF CORRECTION

PATENT NO. : 5,245,437
DATED : September 14, 1993
INVENTOR(S) : Il-Ku Na Page 1 of 4

It is certified that error appears in the above-identified patent and that said Letters Patent is hereby corrected as shown below:

<u>TITLE PAGE</u>

IN THE ABSTRACT

Line 1,   delete "a method" (first occurrence)

Column 1,

Line 18,   change "State" to --States--;

Column 2,

Line 45,   after "corresponding to" insert --the--;

Column 3,

Line 34,   insert a period after "channel";

Line 68,   change "steb" to --step--;

UNITED STATES PATENT AND TRADEMARK OFFICE
CERTIFICATE OF CORRECTION

PATENT NO. : 5,245,437
DATED : September 14, 1993
INVENTOR(S) : Il-Ku Na It is certified that error appears in the above-identified patent and that said Letters Patent is hereby corrected as shown below:

Column 4,

Line 16,     delete "said";

Line 25,     change "On contrary" to --Contrary--;

Line 62,     delete "the";

Column 5,

Line 3,     after "it takes" insert --a--;

Line 6,     change "in stead" to --instead--;

Line 11,     delete "the" (second occurrence);

Line 15,     change "n" to --an--;

UNITED STATES PATENT AND TRADEMARK OFFICE
CERTIFICATE OF CORRECTION

PATENT NO. : 5,245,437
DATED : September 14, 1993
INVENTOR(S) : Il-Ku Na It is certified that error appears in the above-identified patent and that said Letters Patent is hereby corrected as shown below:

Column 5,

Line 64,     after "by" and before "increment", insert --an--;

Column 6,

Line 23,     after "the first pre-set", insert --time, transferring phase locked loop data corresponding to a designated channel of a second--;

Line 53,     after "selected channel" and before the semi-colon, insert --and comparing an auto fine tuning search time with a first predetermined value to determine whether sufficient time has elapsed in which to detect said signal broadcast in accordance with said first one of said modes--;

UNITED STATES PATENT AND TRADEMARK OFFICE
CERTIFICATE OF CORRECTION

PATENT NO. : 5,245,437
DATED : September 14, 1993
INVENTOR(S) : Il-Ku Na It is certified that error appears in the above-identified patent and that said Letters Patent is hereby corrected as shown below:

Column 7,

Line 3,    replace "modes" with --systems--;

Column 10,

Line 25,    replace "aid" with --said--;

Signed and Sealed this

Twenty-third Day of August, 1994

Attest:

BRUCE LEHMAN

*Attesting Officer*    *Commissioner of Patents and Trademarks*